(12) United States Patent
Kim

(10) Patent No.: US 7,830,024 B2
(45) Date of Patent: Nov. 9, 2010

(54) PACKAGE AND FABRICATING METHOD THEREOF

(75) Inventor: Hyeong-No Kim, Paju-Si (KR)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 16 days.

(21) Appl. No.: 12/285,348

(22) Filed: Oct. 2, 2008

(65) Prior Publication Data
US 2010/0084772 A1 Apr. 8, 2010

(51) Int. Cl.
H01L 23/48 (2006.01)
H01L 23/49 (2006.01)

(52) U.S. Cl. ............ 257/784; 257/786; 257/E23.01; 257/E23.024; 257/E23.037; 257/E23.07; 438/121

(58) Field of Classification Search .......... 438/121, 438/124, 127; 257/782, 784, 786, E23.01, 257/E23.023, E23.024, E23.031, E23.037, 257/E23.07
See application file for complete search history.

(56) References Cited

U.S. PATENT DOCUMENTS

| | | | |
|---|---|---|---|
| 6,664,138 B2 * | 12/2003 | Igarashi et al. ............ | 438/126 |
| 6,720,209 B2 * | 4/2004 | Igarashi et al. ............ | 438/126 |
| 6,883,231 B2 * | 4/2005 | Igarashi et al. ............ | 29/840 |
| 6,989,291 B2 * | 1/2006 | Igarashi et al. ............ | 438/106 |
| 7,030,033 B2 * | 4/2006 | Igarashi et al. ............ | 438/754 |
| 7,045,393 B2 | 5/2006 | Igarashi et al. | |
| 2004/0092129 A1 * | 5/2004 | Igarashi et al. ............ | 438/754 |
| 2004/0097081 A1 * | 5/2004 | Igarashi et al. ............ | 438/689 |
| 2004/0097086 A1 * | 5/2004 | Igarashi et al. ............ | 438/690 |
| 2004/0106288 A1 * | 6/2004 | Igarashi et al. ............ | 438/689 |

* cited by examiner

*Primary Examiner*—Mary Wilczewski
(74) *Attorney, Agent, or Firm*—Bacon & Thomas, PLLC

(57) ABSTRACT

A package and a fabricating method thereof are provided. The package includes a conductive layer, a chip, a plurality of first pads, a plurality of bonding wires and a sealant. The conductive layer has a die pad and includes a plurality of wires. A path of each wire is substantially parallel to a supporting surface of the die pad. Each wire has an upper surface and a lower surface. The chip disposed on the supporting surface has a plurality of pads. The first pads are correspondingly formed on the upper surfaces of the wires. The bonding wires electrically connect the pads of the chip to the first pads. The sealant seals up the conductive layer, the first pads, the chip and the bonding wires, and exposes the lower surface of the conductive layer. The conductive layer projects from a bottom surface of the sealant.

6 Claims, 11 Drawing Sheets

PACKAGE AND FABRICATING METHOD THEREOF

BACKGROUND OF THE INVENTION

1. Field of the Invention

The invention relates in general to a package and a fabricating method thereof, and more particularly to a package exposing a die pad and a fabricating method thereof.

2. Description of the Related Art

Nowadays, the function of the electronic product is getting more and more powerful, and the consumed power is correspondingly increased. As the consumed power is increased, the loading of electrical elements in the electronic product becomes heavier and heavier. Thus, more and more heat is generated. So, the heat dissipating property of the electrical element becomes more and more emphasized.

An electrical element, such as a package, almost has a chip fully sealed in a sealant. Such a package is undoubtedly a great stoppage for the heat dissipation. Although the heat dissipating amount is increased by adding heat dissipation fins to the package, the heat dissipating ability of the package cannot be satisfied forever. Thus, it is an important subject to enhance the heat dissipating ability of the package in the industry.

SUMMARY OF THE INVENTION

The invention is directed to a package and a fabricating method thereof, wherein a surface contact area between a die pad and an outside of the package is enlarged by making the die pad project from a bottom surface of a sealant. Therefore, the heat dissipating property of the package is enhanced.

According to a first aspect of the present invention, a package is provided. The package includes a conductive layer, a chip, a plurality of first pads, a plurality of bonding wires and a sealant. The conductive layer has a die pad and includes a plurality of wires. A path of each wire is substantially parallel to a supporting surface of the die pad, and each wire has an upper surface and a lower surface. The chip is disposed on the supporting surface and has a plurality of pads. The first pads are correspondingly formed on the upper surfaces of the wires. The bonding wires electrically connect the pads of the chip to the first pads. The sealant seals up the conductive layer, the first pads, the chip and the bonding wires and exposes a lower surface of the conductive layer. The conductive layer projects from a bottom surface of the sealant.

According to a second aspect of the present invention, a fabricating method of a package is provided. The fabricating method includes the following steps. A carrier is provided. A trace pattern layer is formed on an upper surface of the carrier. A conductive layer is formed on the upper surface of the carrier. The conductive layer and the trace pattern layer are complementary to each other. The conductive layer has a die pad and includes a plurality of wires. A path of each wire is substantially parallel to a supporting surface of the die pad, and each wire has an upper surface and a lower surface. A plurality of first pads is correspondingly formed on the upper surfaces of the wires. A chip having a plurality of pads is disposed on the supporting surface. A plurality of bonding wires is provided to electrically connect the pads of the chip to the first pads. A sealant is provided to seal up the conductive layer, the first pads, the chip and the bonding wires. The carrier and the trace pattern layer are removed to expose a lower surface of the conductive layer, wherein the conductive layer projects from a bottom surface of the sealant.

The invention will become apparent from the following detailed description of the preferred but non-limiting embodiments. The following description is made with reference to the accompanying drawings.

DETAILED DESCRIPTION OF THE INVENTION

First Embodiment

Figure 1:
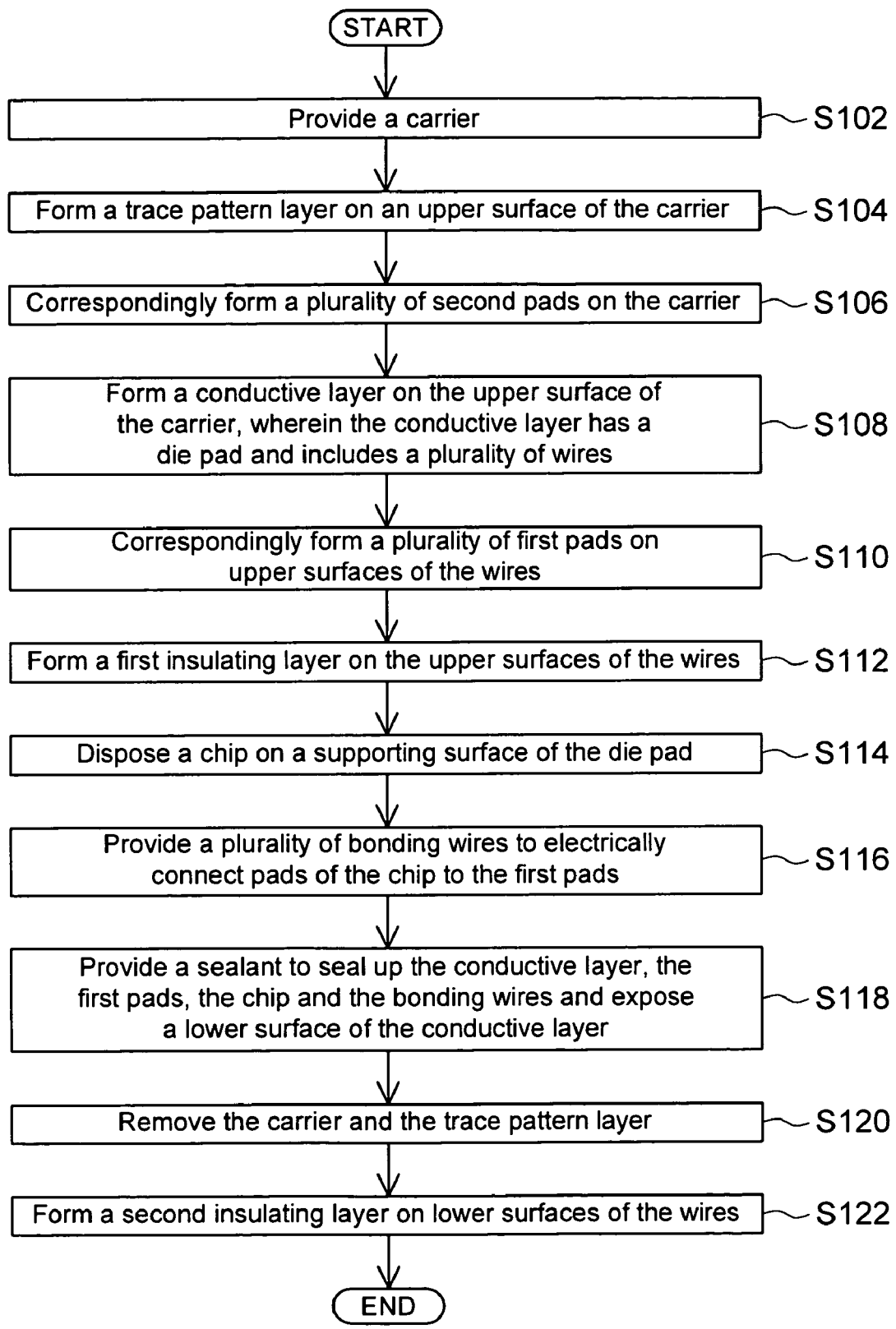
FIG. 1 is a flow chart showing a fabricating method of a package according to a first embodiment of the invention.

FIG. 1 is a flow chart showing a fabricating method of a package according to a first embodiment of the invention. Referring to FIG. 1, the fabricating method of the package includes the following steps.

Figure 2:
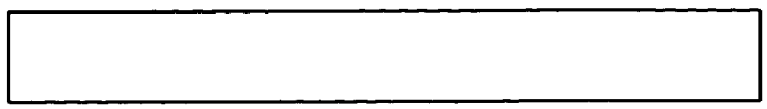
FIG. 2 is a cross-sectional view showing a carrier according to the first embodiment of the invention.

FIG. 2 is a cross-sectional view showing a carrier according to the first embodiment of the invention. First, as shown in step S102 of FIG. 2, a carrier 202 is provided. The material of the carrier 202 is metal, such as copper.

Figure 3A:
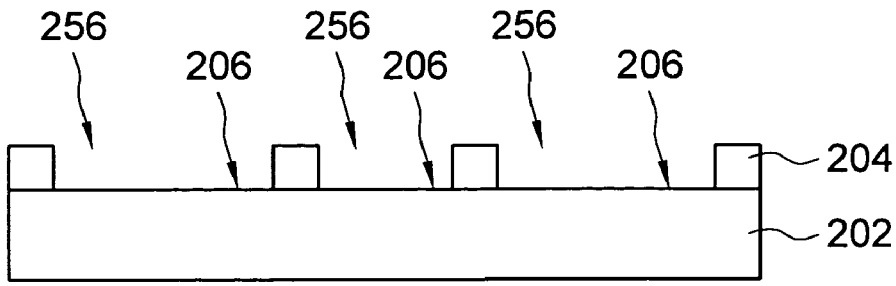
FIG. 3A is a cross-sectional view showing the carrier formed with a trace pattern layer according to the first embodiment of the invention.
Figure 3B:
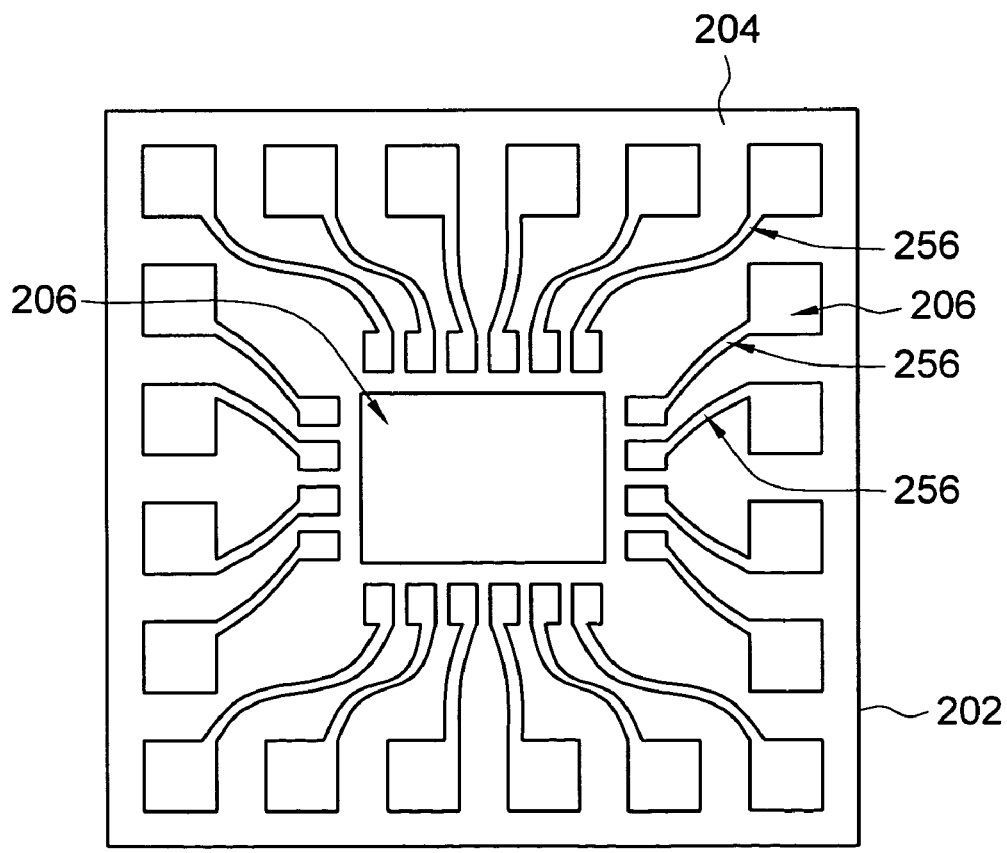
FIG. 3B is a top view showing the carrier of FIG. 3A formed with the trace pattern layer.

FIG. 3A is a cross-sectional view showing the carrier formed with a trace pattern layer according to the first embodiment of the invention. FIG. 3B is a top view showing the carrier of FIG. 3A formed with the trace pattern layer. As shown in FIGS. 3A and 3B, a trace pattern layer 204 is formed on an upper surface 206 of the carrier 202 in step S104. The trace pattern layer 204 exposes a plurality of spaces 256. The material of the trace pattern layer 204 is metal, such as copper.

Figure 4A:
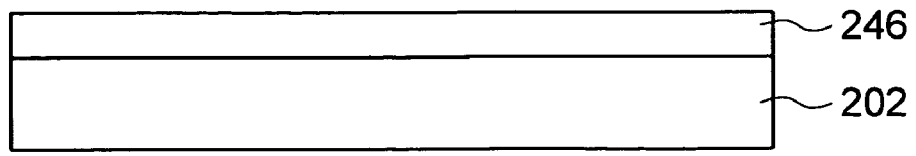
FIGS. 4A to 4C are schematic illustrations showing steps of forming the trace pattern layer of FIG. 3A.
Figure 4B:
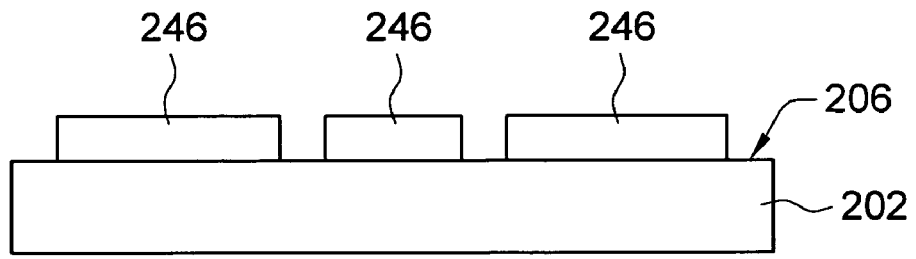
Figure 4C:
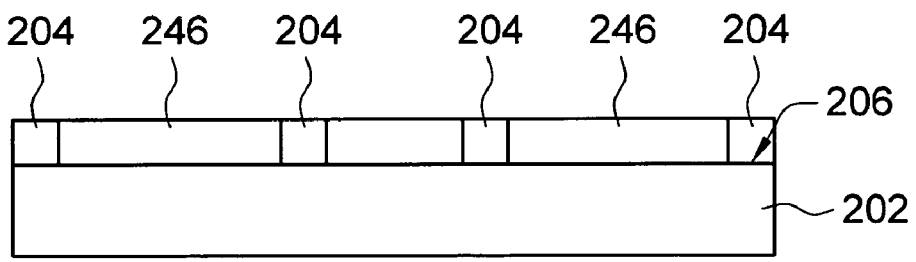

FIGS. 4A to 4C are schematic illustrations showing steps of forming the trace pattern layer of FIG. 3A. Referring to FIGS. 4A to 4C, the steps of forming the trace pattern layer 204 are described in the following. As shown in FIG. 4A, a resist layer 246 is formed on the upper surface 206 of the carrier after the step S104. Next, as shown in FIG. 4B, the resist layer 246 is patterned. Then, as shown in FIG. 4C, the trace pattern layer 204 is formed on the upper surface 206 of the carrier. Then, the resist layer 246 is removed and then the trace pattern layer 204 shown in FIG. 3A is left.

Figure 5:
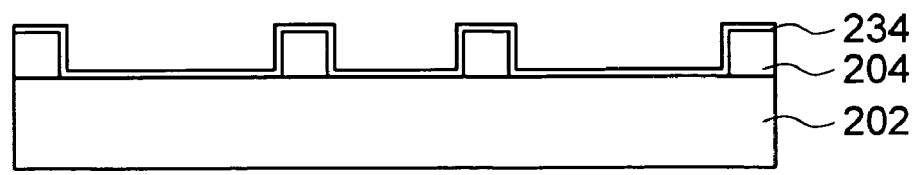
FIG. 5 is a cross-sectional view showing the carrier formed with an organic film according to the first embodiment of the invention.

FIG. 5 is a cross-sectional view showing the carrier formed with an organic film according to the first embodiment of the invention. As shown in FIG. 5, the fabricating method further includes the step of forming an organic film 234 on the carrier 202 and the trace pattern layer 204 after the step S104. The organic film 234 may be adhesive and can be adhered to the carrier 202 and the trace pattern layer 204. The organic film 234 may be formed by way of chemical processing.

Figure 6:
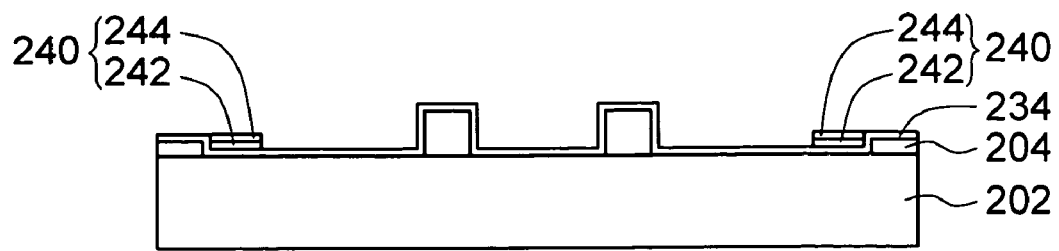
FIG. 6 is a cross-sectional view showing the carrier formed with second pads according to the first embodiment of the invention.

FIG. 6 is a cross-sectional view showing the carrier formed with second pads according to the first embodiment of the invention. Then, as shown in FIG. 6, a plurality of second pads 240 is correspondingly formed on the carrier 202 in step S106. The second pad 240 includes a gold layer 242 and a nickel layer 244. That is, the second pad 240 is formed in two steps, wherein the gold layer 242 is formed on the carrier 202 after the step S104, and then the nickel layer 244 is formed on the gold layer 242.

Figure 7:
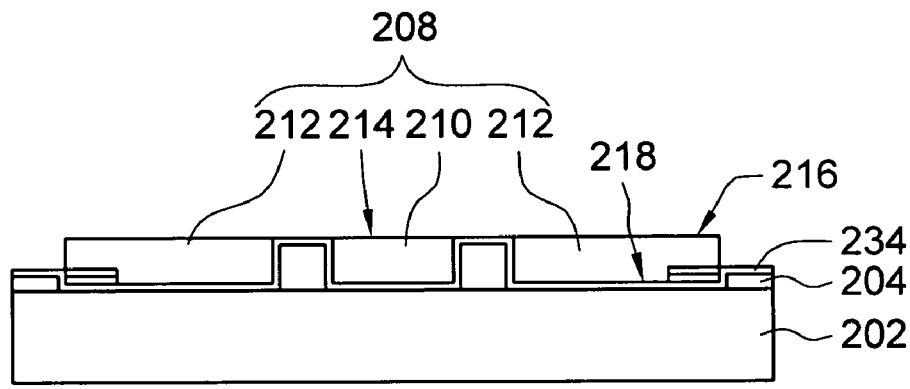
FIG. 7 is a cross-sectional view showing the carrier formed with a conductive layer according to the first embodiment of the invention.

FIG. 7 is a cross-sectional view showing the carrier formed with a conductive layer according to the first embodiment of the invention. Next, as shown in FIG. 7, a conductive layer 208 is formed on the upper surface 206 of the carrier in step S108. The conductive layer 208 and the trace pattern layer 204 are complementary to each other. That is, the conductive layer 208 fills the spaces 256 of FIG. 3A. The conductive layer 208 has a die pad 210 and includes a plurality of wires 212. Each wire 212 has an upper surface 216 and a lower surface 218.

Figure 8:
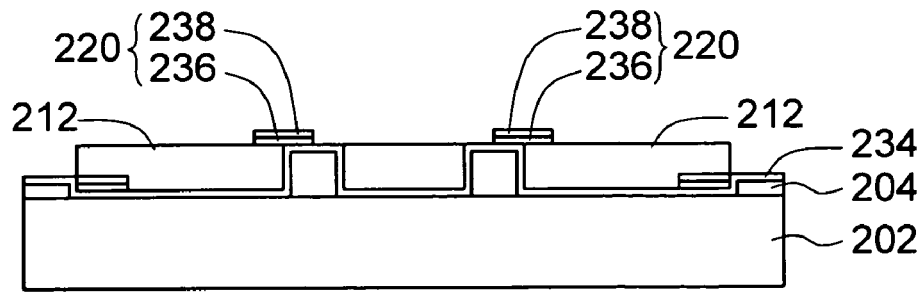
FIG. 8 is a cross-sectional view showing the carrier formed with first pads according to the first embodiment of the invention.

FIG. 8 is a cross-sectional view showing the carrier formed with first pads according to the first embodiment of the invention. Then, as shown in FIG. 8, a plurality of first pads 220 is correspondingly formed on the upper surfaces 216 of the wires in step S110. The first pad 220 includes a nickel layer 236 and a gold layer 238. That is, the first pad 220 is formed in two steps, wherein the nickel layer 236 is formed on the wire 212 after the step S108, and then the gold layer 238 is formed on the nickel layer 236.

Figure 9:
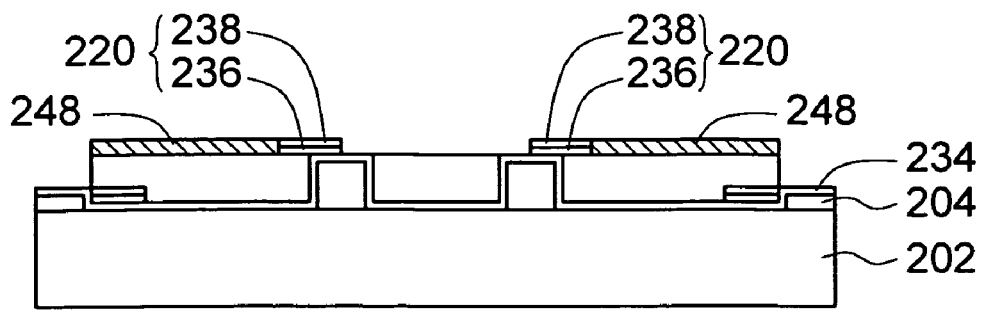
FIG. 9 is a cross-sectional view showing the carrier formed with a first insulating layer according to the first embodiment of the invention.

FIG. 9 is a cross-sectional view showing the carrier formed with a first insulating layer according to the first embodiment of the invention. Next, as shown in FIG. 9, a first insulating layer 248 is formed on the upper surface 216 of the wire (depicted in FIG. 7) in step S112, and the first insulating layer 248 exposes the first pads 220. The first insulating layer 248 may be formed by way of, for example, chemical dipping.

Figure 10:
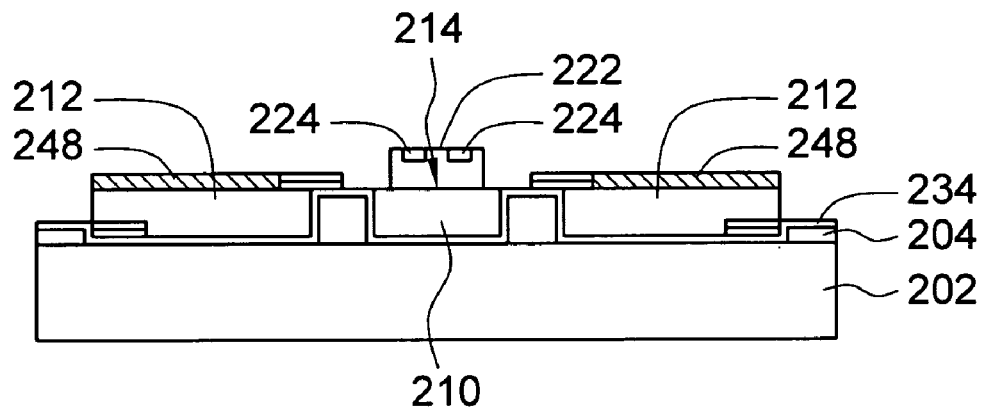
FIG. 10 is a cross-sectional view showing the carrier formed with a chip according to the first embodiment of the invention.

FIG. 10 is a cross-sectional view showing the carrier formed with a chip according to the first embodiment of the invention. Then, as shown in FIG. 10, a chip 222 having a plurality of pads 224 is disposed on a supporting surface 214 in step S114.

Figure 11:
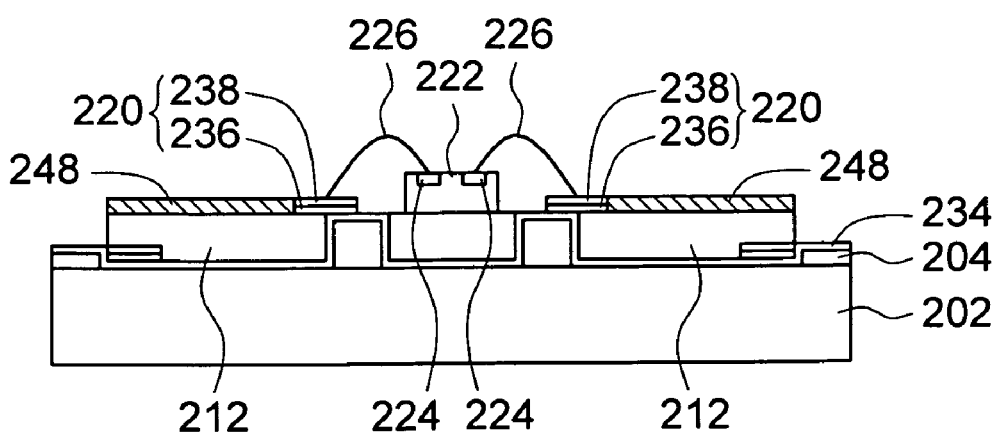
FIG. 11 is a cross-sectional view showing the carrier formed with bonding wires according to the first embodiment of the invention.

FIG. 11 is a cross-sectional view showing the carrier formed with bonding wires according to the first embodiment of the invention. Then, as shown in FIG. 11, a plurality of bonding wires 226 electrically connects the pads 224 to the first pads 220 in step S116.

Figure 12:
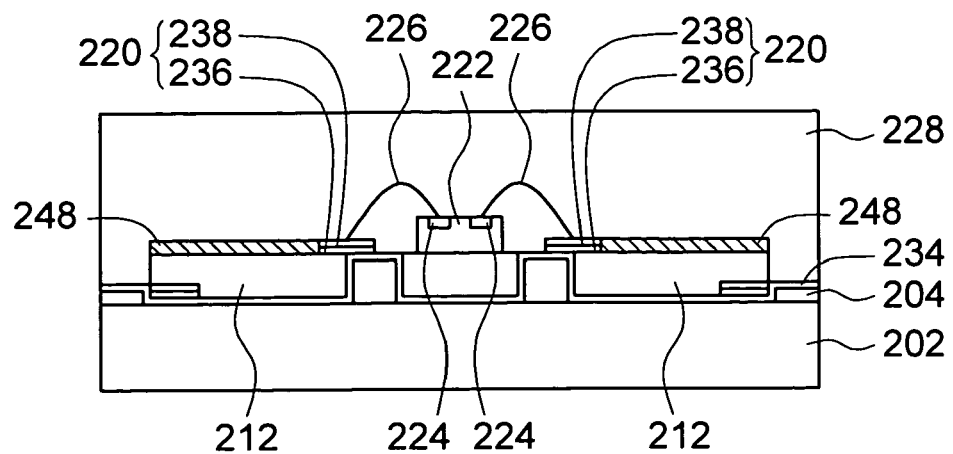
FIG. 12 is a cross-sectional view showing the carrier formed with a sealant according to the first embodiment of the invention.

FIG. 12 is a cross-sectional view showing the carrier formed with a sealant according to the first embodiment of the invention. Next, as shown in FIG. 12, a sealant 228 is provided to seal up the conductive layer 208, the first pads 220, the chip 222 and the bonding wires 226 in step S118.

Figure 13:
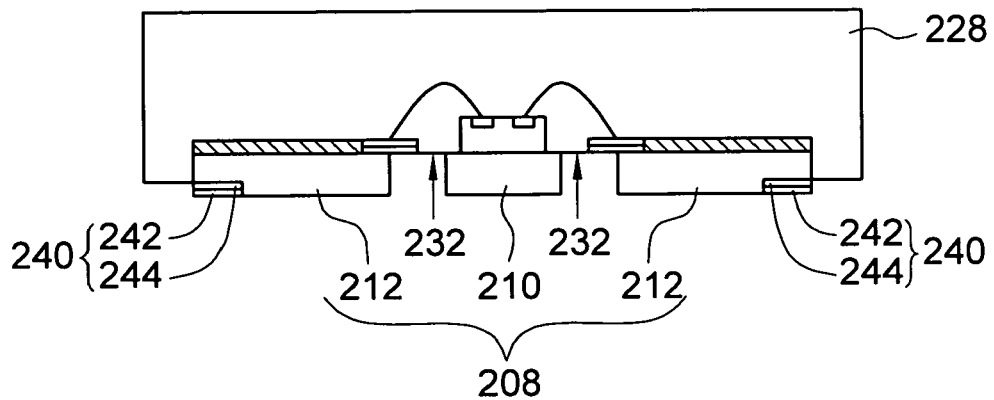
FIG. 13 is a cross-sectional view showing a structure after the carrier and the trace pattern layer of FIG. 12 are removed.

FIG. 13 is a cross-sectional view showing a structure after the carrier and the trace pattern layer of FIG. 12 are removed. Then, as shown in FIG. 13, the carrier 202 and the trace pattern layer 204 are removed to expose a lower surface 230 of the conductive layer 208 in step S120. That is, after the carrier 202 and the trace pattern layer 204 are removed, a lower surface of a die pad 210 and the lower surfaces of the wires 212 are exposed. The carrier 202 and the trace pattern layer 204 may be removed by way of, for example, peeling off. Because the organic film 234 is adhered to the carrier 202 and the trace pattern layer 204, the organic film 234, the carrier 202 and the trace pattern layer 204 can be peeled off by a slight force provided by a hand, for example.

Because the conductive layer 208 and the trace pattern layer 204 are complementary to each other, as shown in FIG. 7, the lower surface of the die pad 210 and the lower surfaces of the wires 212 are exposed and further project from a bottom surface 232 of the sealant 228 after the trace pattern layer 204 is removed, as shown in FIG. 13. Because the conductive layer 208 (i.e., the die pad 210 and the wire 212) projects from the bottom surface 232 of the sealant 228, the surface contact area between the conductive layer 208 and the outside of a package 252 is enlarged. Thus, the heat generated by the chip 222 can be rapidly conducted to the outside via the die pad 210 so that the heat dissipating property of the package 252 can be enhanced.

Figure 14:
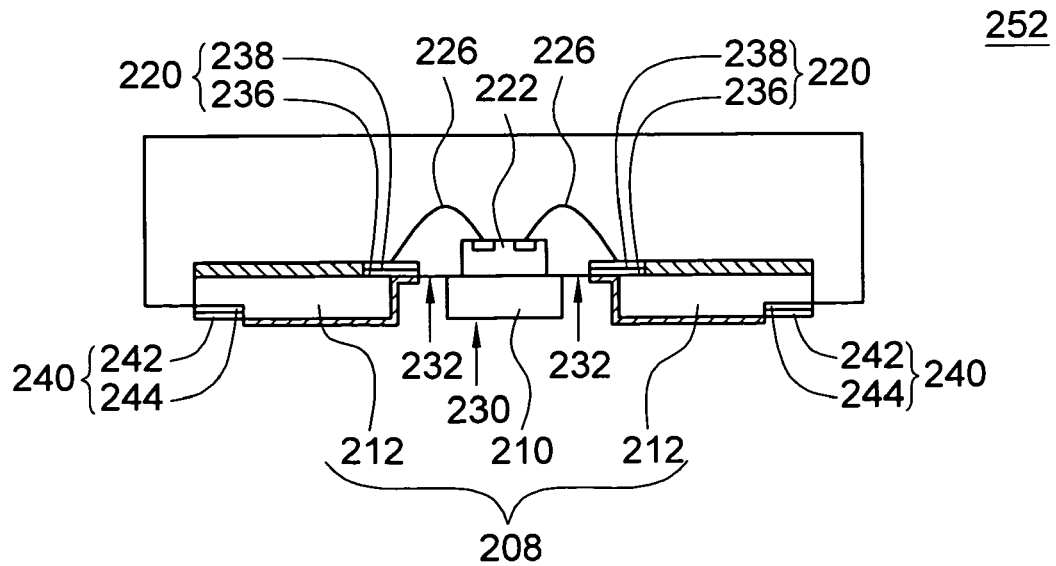
FIG. 14 is a cross-sectional view showing the carrier formed with a second insulating layer according to the first embodiment of the invention.

FIG. 14 is a cross-sectional view showing the carrier formed with a second insulating layer according to the first embodiment of the invention. As shown in FIG. 14, a second insulating layer 250 (not shown in FIG. 14) for exposing the second pads 240 is formed on the lower surface 218 of the wire in step S122. Similarly, the second insulating layer 250 may be formed by way of, for example, chemical dipping. The package 252 according to the first embodiment of the invention is completed.

Figure 15:
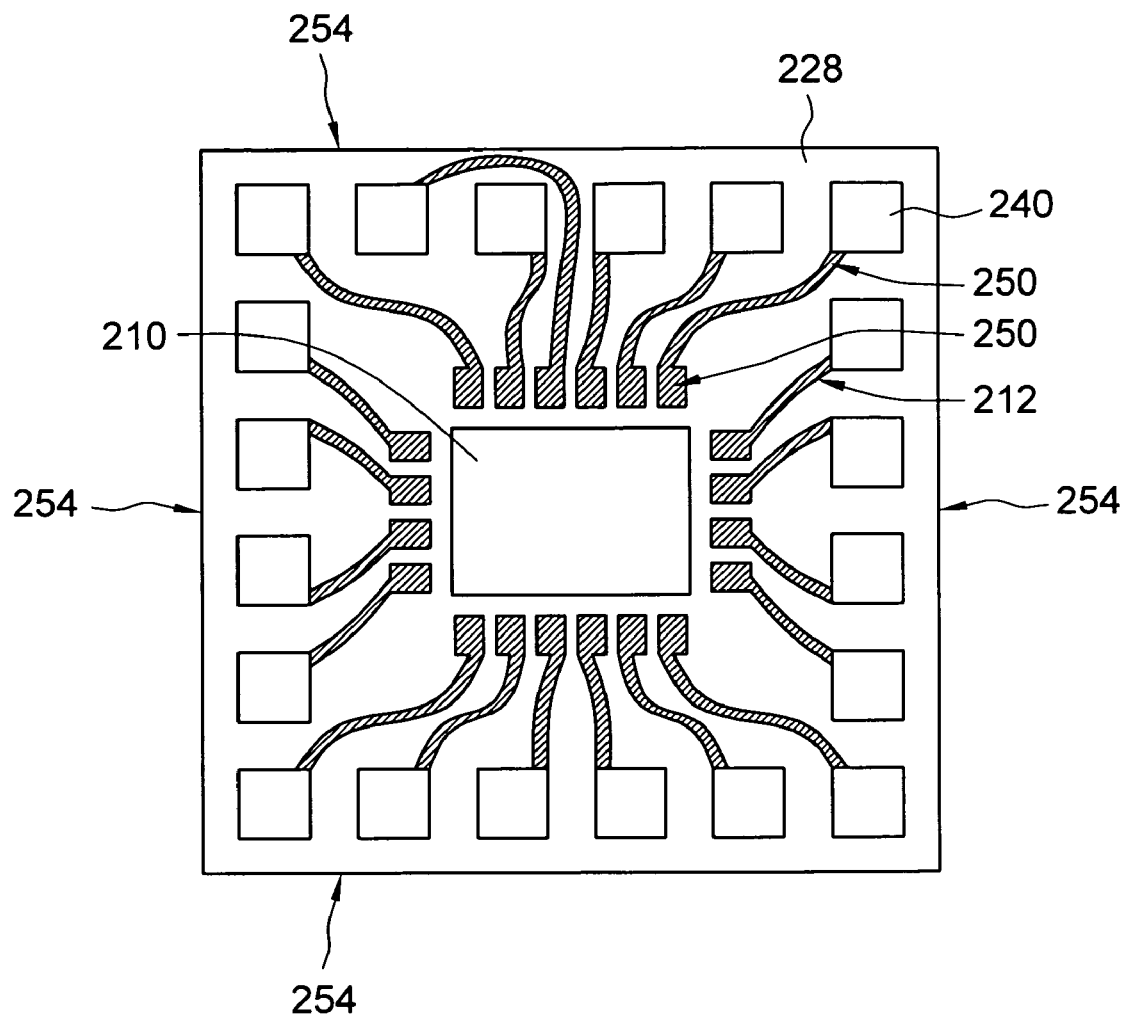
FIG. 15 is a bottom view showing a package 252 of FIG. 14.

FIG. 15 is a bottom view showing the package 252 of FIG. 14. In addition, as shown in FIG. 15, a path of the wire 212 is substantially parallel to the supporting surface 214 (depicted in FIG. 7) of the die pad 210. That is, each of the second pads 240 of the first embodiment is located at one end of the wires 212, and this end extends to four edges 254 adjacent to the package 252 along the supporting surface 214. The package 252 may be electrically connected to an external element, such as a circuit board (not shown), via the second pads 240 extending to the four edges 254.

Second Embodiment

Figure 16:
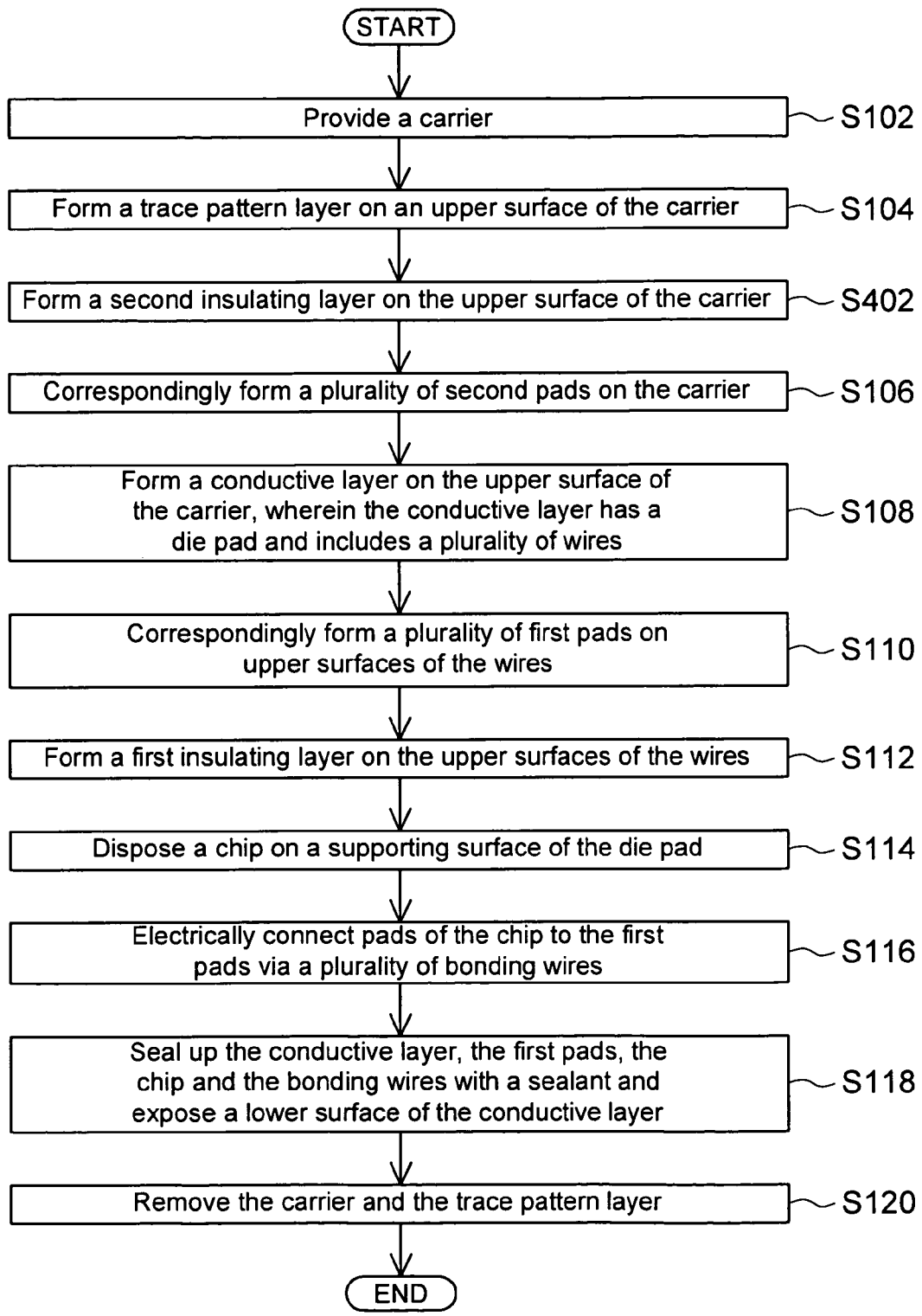
FIG. 16 is a flow chart showing a fabricating method of a package according to a second embodiment of the invention.
Figure 17A:
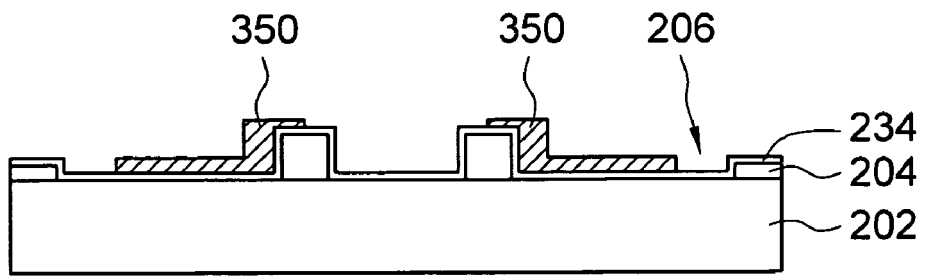
FIGS. 17A to 17I are schematic illustrations showing structures corresponding to the steps of FIG. 16.

FIG. 16 is a flow chart showing a fabricating method of a package according to a second embodiment of the invention. FIGS. 17A to 17I are schematic illustrations showing structures corresponding to the steps of FIG. 16. As shown in FIGS. 16 and 17A to 17I, the difference between the second embodiment and the first embodiment is that the step S402 of forming a second insulating layer may follow the step S104. FIG. 17A is a cross-sectional view showing a carrier formed with the second insulating layer according to the second embodiment of the invention. That is, as shown in FIG. 17A, a second insulating layer 350 is formed on the carrier 202 after the step S104 is performed and the organic film 234 is formed.

Figure 17B:
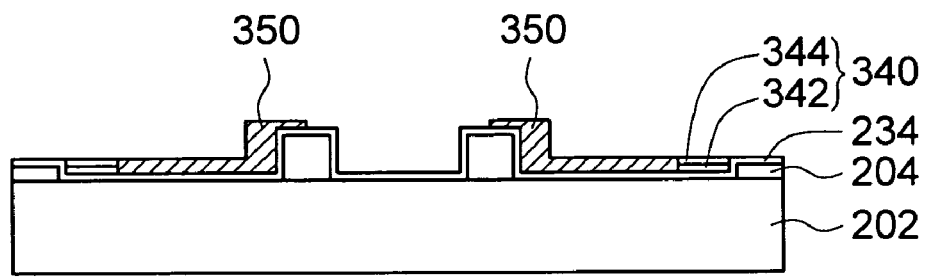

FIG. 17B is a cross-sectional view showing the carrier formed with second pads according to the second embodiment of the invention. Then, as shown in FIG. 17B, a plurality of second pads 340 is correspondingly formed on the carrier 202 in the step S106. Similarly, the second pad 340 also includes a gold layer 342 and a nickel layer 344. That is, the second pad 340 is formed in two steps, wherein the gold layer 342 is formed on the carrier 202 after the step S402, and then the nickel layer 344 is formed on the gold layer 342.

Figure 17C:
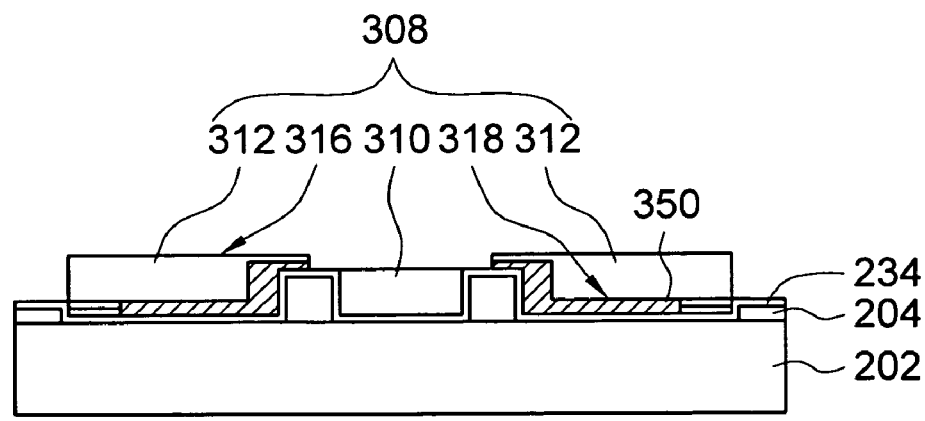

FIG. 17C is a cross-sectional view showing the carrier formed with a conductive layer according to the second embodiment of the invention. Next, as shown in FIG. 17C, a conductive layer 308 is formed on the carrier 202 in the step S108, wherein the conductive layer 308 and the trace pattern layer 204 are complementary to each other. The conductive layer 308 has a die pad 310 and includes a plurality of wires 312. Each wire 312 has an upper surface 316 and a lower surface 318.

Figure 17D:
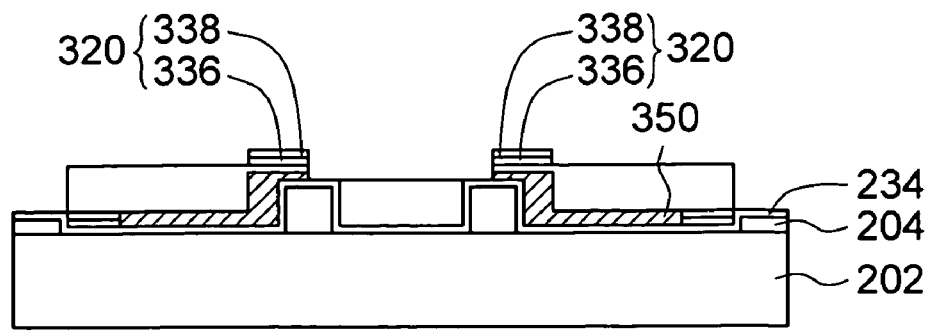

FIG. 17C is a cross-sectional view showing the carrier formed with first pads according to the second embodiment of the invention. Then, as shown in FIG. 17D, a plurality of first pads 320 is correspondingly formed on the upper surfaces 316 of the wires in the step S110. The first pad 320 includes a nickel layer 336 and a gold layer 338. That is, the first pad 320 is formed in two steps, wherein the nickel layer 336 is formed on the wire 312 after the step S108 and then the gold layer 338 is formed on the nickel layer 336.

Figure 17E:
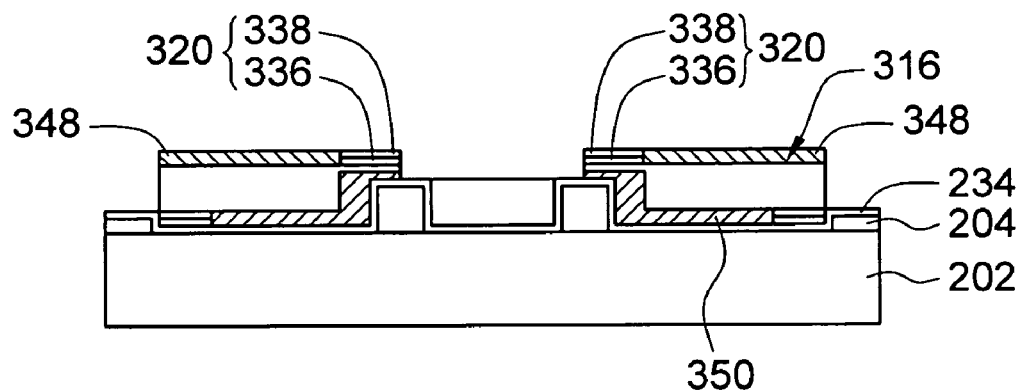

FIG. 17E is a cross-sectional view showing the carrier formed with a first insulating layer according to the second embodiment of the invention. As shown in FIG. 17E, a first insulating layer 348 is formed on the upper surface 316 of the wire in the step S112, wherein the first insulating layer 348 exposes the first pads 320.

Figure 17F:
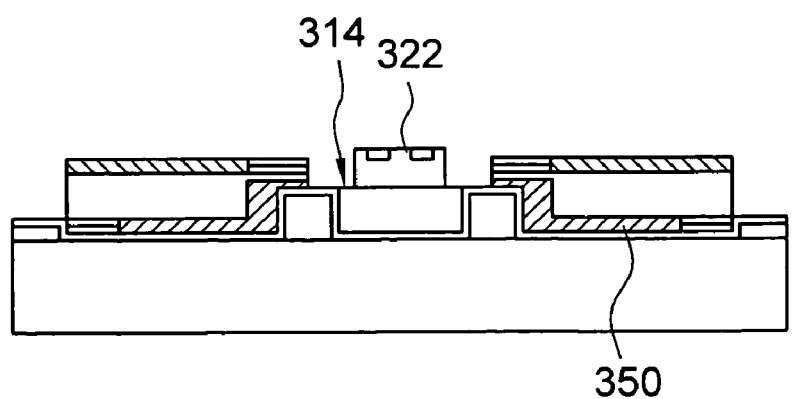

FIG. 17F is a cross-sectional view showing the carrier formed with a chip according to the second embodiment of the invention. As shown in FIG. 17F, a chip 322 is disposed on a supporting surface 314 in the step S114.

Figure 17G:
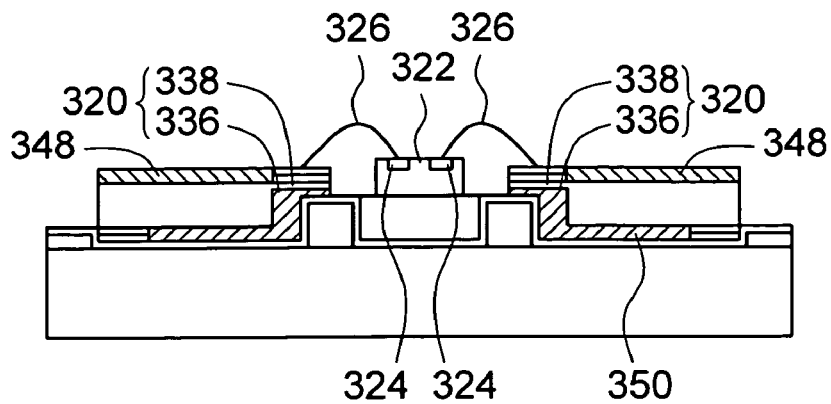

FIG. 17G is a cross-sectional view showing the carrier formed with bonding wires according to the second embodiment of the invention. As shown in FIG. 17G, bonding wires 326 are provided to electrically connect pads 324 of the chip 322 to the first pads 320 in the step S116.

Figure 17H:
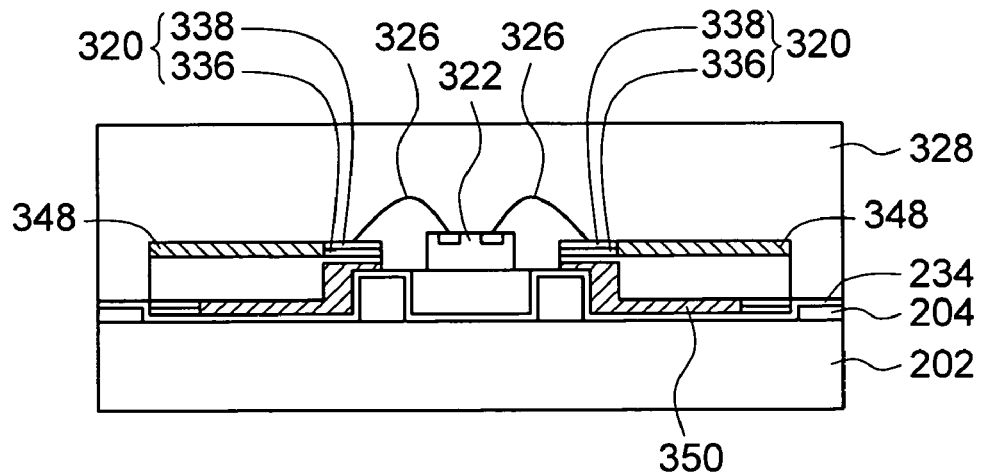

FIG. 17H is a cross-sectional view showing the carrier formed with a sealant according to the second embodiment of the invention. As shown in FIG. 17H, a sealant 328 is provided to seal up the conductive layer 308, the first pads 320, the chip 322 and the bonding wires 326 in the step S118.

Figure 17I:
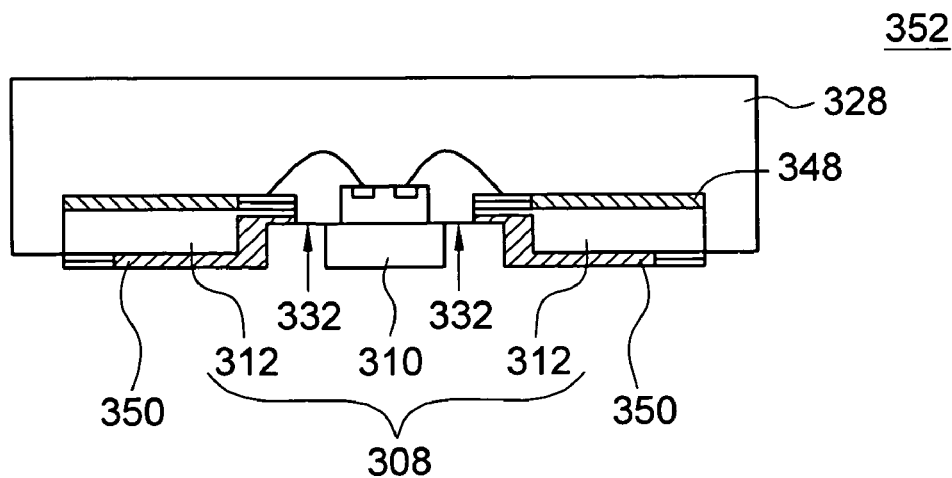

FIG. 17I is a cross-sectional view showing the structure after the carrier and the trace pattern layer of FIG. 17H are removed. As shown in the step S120, the carrier 202 and the trace pattern layer 204 are removed to expose a lower surface 330 of the conductive layer 308. Thus, a package 352 according to the second embodiment of the invention is completed.

As shown in FIG. 17I, the conductive layer 308 projects from a bottom surface 332 of the sealant 328 so that the surface contact area between the conductive layer 308 and the outside of the package 352 is enlarged. So, the heat generated by the chip 322 may be rapidly conducted to the outside so that the heat dissipating property of the package 352 is enhanced.

In the package and the fabricating method thereof according to each embodiment of the invention, the conductive layer projects from the bottom surface of the sealant so that the surface contact area between the conductive layer and the outside of the package is enlarged. Thus, the heat generated by the chip can be rapidly conducted to the outside via the die pad so that the heat dissipating property of the package is enhanced.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A package, comprising:
   a conductive layer having a die pad and comprising a plurality of wires, wherein a path of each of the wires is substantially parallel to a supporting surface of the die pad, and each of the wires has an upper surface and a lower surface;
   a plurality of second pads correspondingly formed on the lower surfaces of the wires;
   a chip, which is disposed on the supporting surface and has a plurality of pads;
   a plurality of first pads correspondingly formed on the upper surfaces of the wires;
   a plurality of bonding wires electrically connecting the pads of the chip to the first pads; and
   a sealant for sealing up the conductive layer, the first pads, the chip and the bonding wires and exposing a lower surface of the conductive layer,
   wherein the conductive layer projects from a bottom surface of the sealant.

2. The package according to claim 1, further comprising:
   a first insulating layer formed on the upper surfaces of the wires, wherein the first insulating layer exposes the first pads.

3. The package according to claim 1, wherein each of the second pads comprises:
   a nickel (Ni) layer formed on the wires; and
   a gold (Au) layer formed on the nickel layer.

4. The package according to claim 1, further comprising:
   a second insulating layer formed on the lower surfaces of the wires, wherein the second insulating layer exposes the second pads.

5. The package according to claim 1, wherein each of the first pads comprises:
   a nickel layer formed on the wires; and
   a gold layer formed on the nickel layer.

6. The package according to claim 1, wherein a material of the conductive layer is copper.

* * * * *